United States Patent
Chang et al.

(10) Patent No.: US 10,734,039 B2
(45) Date of Patent: Aug. 4, 2020

(54) VOLTAGE-ENHANCED-FEEDBACK SENSE AMPLIFIER OF RESISTIVE MEMORY AND OPERATING METHOD THEREOF

(71) Applicant: NATIONAL TSING HUA UNIVERSITY, Hsinchu (TW)

(72) Inventors: Meng-Fan Chang, Taichung (TW); Huan-Ting Lin, Taoyuan (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 37 days.

(21) Appl. No.: 16/145,134

(22) Filed: Sep. 27, 2018

(65) Prior Publication Data

US 2020/0105315 A1   Apr. 2, 2020

(51) Int. Cl.
| | | |
|---|---|---|
| G11C 11/00 | (2006.01) | |
| G11C 7/08 | (2006.01) | |
| G11C 13/00 | (2006.01) | |
| G11C 11/16 | (2006.01) | |
| G11C 7/12 | (2006.01) | |
| G11C 7/06 | (2006.01) | |

(52) U.S. Cl.
CPC ............ *G11C 7/08* (2013.01); *G11C 7/065* (2013.01); *G11C 7/12* (2013.01); *G11C 11/1655* (2013.01); *G11C 11/1673* (2013.01); *G11C 13/004* (2013.01); *G11C 13/0026* (2013.01); *G11C 2013/005* (2013.01)

(58) Field of Classification Search
CPC .................................................. G11C 13/004
USPC ................................................... 365/189.011
See application file for complete search history.

(56) References Cited

U.S. PATENT DOCUMENTS

| | | | | |
|---|---|---|---|---|
| 6,088,278 A | * | 7/2000 | Porter | G11C 7/065 327/57 |
| 2007/0177422 A1 | * | 8/2007 | McAdams | G11C 7/062 365/183 |
| 2012/0314484 A1 | * | 12/2012 | Koya | G11C 7/16 365/149 |
| 2015/0187414 A1 | * | 7/2015 | Perner | G11C 13/004 365/148 |

OTHER PUBLICATIONS

Rainer et al. 1987 IEEE International Solid-State Conference "A Sense-Signal Doubling Circuit for DRAMs" (Year: 1987).*

* cited by examiner

*Primary Examiner* — Min Huang
(74) *Attorney, Agent, or Firm* — CKC & Partners Co., LLC

(57) ABSTRACT

A voltage-enhanced-feedback sense amplifier of a resistive memory is configured to sense a first bit line and a second bit line. The voltage-enhanced-feedback sense amplifier includes a voltage sense amplifier and a voltage-enhanced-feedback pre-amplifier. The voltage-enhanced-feedback pre-amplifier is electrically connected to the voltage sense amplifier. A first bit-line amplifying module receives a voltage level of the second input node to suppress a voltage drop of the first bit line and amplifies a voltage level of the first input node according to a voltage level of the first bit line. A second bit-line amplifying module receives the voltage level of the first input node to suppress a voltage drop of the second bit line and amplifies the voltage level of the second input node according to a voltage level of the second bit line. A margin enhanced voltage difference is greater than a read voltage difference.

18 Claims, 12 Drawing Sheets

US 10,734,039 B2

VOLTAGE-ENHANCED-FEEDBACK SENSE AMPLIFIER OF RESISTIVE MEMORY AND OPERATING METHOD THEREOF

BACKGROUND

Technical Field

The present disclosure relates to a sense amplifier of a resistive memory and an operating method thereof. More particularly, the present disclosure relates to a voltage-enhanced-feedback sense amplifier of a resistive memory and an operating method thereof which are capable of enhancing effective sensing margin and increasing sensing yield.

Description of Related Art

In these years, due to the industrial growth of mobile device, medical electrical equipment, portable storage, etc., requirement of memory with low power, high speed and high density is increased. However, sensing margin time of the memory is the key factor which may limit the access time of the memory. It is known to provide memory circuitry including an array of bit cells within which columns of bit cells are connected by bit line pairs. The bit line pairs are precharged to a given voltage and then one of the bit lines of the pair is discharged depending upon the contents of the bit cell within a column that is read. The difference in voltage which arises between the bit lines of the bit line pair as a result of this discharge is sensed by a sense amplifier coupled to the bit lines.

In a long bit-line length resistive memory array, developing time would be a bottleneck in sensing operation since it takes lots of time to accumulate a slow-growing voltage difference between a bit-line voltage and a reference voltage. Decreasing of developing time leads to read failure because the voltage difference between the bit-line voltage and the reference voltage is smaller than an offset voltage from the sense amplifier. Furthermore, when a resistance value of a resistive type memory is low, the bit lines drop quickly to a ground voltage, and the sensing time of the resistive type memory will be easily affected by a bit line length, so that a small voltage difference between the bit lines is produced to cause low sensing yield and low sensing speed. Therefore, a voltage-enhanced-feedback sense amplifier of a resistive memory and an operating method thereof having the features of decreasing developing time to improve sensing performance with shorter read access time and increasing sensing yield are commercially desirable.

SUMMARY

According to one aspect of the present disclosure, a voltage-enhanced-feedback sense amplifier of a resistive memory is configured to sense a first bit line and a second bit line. The voltage-enhanced-feedback sense amplifier of the resistive memory includes a voltage sense amplifier and a voltage-enhanced-feedback pre-amplifier. The voltage sense amplifier has a first input node and a second input node. The voltage-enhanced-feedback pre-amplifier is electrically connected to the voltage sense amplifier. The voltage-enhanced-feedback pre-amplifier includes a first bit-line amplifying module and a second bit-line amplifying module. The first bit-line amplifying module has a first internal node. The second bit-line amplifying module has a second internal node. The first bit-line amplifying module includes a first transistor, a first capacitor, a second transistor, a third transistor, a fourth transistor and a first switching element. The first transistor is coupled to a read voltage, the first bit line and the second input node. The first capacitor is coupled between the first bit line and the first internal node. The second transistor is coupled between a power supply voltage and the first internal node. The third transistor is coupled to the first input node, the first internal node and a ground voltage. The fourth transistor is coupled to the power supply voltage, the first input node and the first internal node. The first switching element is coupled between the first input node and the first internal node. The second bit-line amplifying module includes a fifth transistor, a second capacitor, a sixth transistor, a seventh transistor, an eighth transistor and a second switching element. The fifth transistor is coupled to the read voltage, the second bit line and the first input node. The second capacitor is coupled between the second bit line and the second internal node. The sixth transistor is coupled between the power supply voltage and the second internal node. The seventh transistor is coupled to the second input node, the second internal node and the ground voltage. The eighth transistor is coupled to the power supply voltage, the second input node and the second internal node. The second switching element is coupled between the second input node and the second internal node. There is a read voltage difference between a voltage level of the first bit line and a voltage level of the second bit line. There is a margin enhanced voltage difference between a voltage level of the first input node and a voltage level of the second input node, and the margin enhanced voltage difference is greater than the read voltage difference.

According to another aspect of the present disclosure, a voltage-enhanced-feedback sense amplifier of a resistive memory is configured to sense a first bit line and a second bit line. The voltage-enhanced-feedback sense amplifier of the resistive memory includes a voltage sense amplifier and a voltage-enhanced-feedback pre-amplifier. The voltage sense amplifier has a first input node and a second input node. The voltage-enhanced-feedback pre-amplifier is electrically connected to the voltage sense amplifier. The voltage-enhanced-feedback pre-amplifier includes a first bit-line amplifying module and a second bit-line amplifying module. The first bit-line amplifying module is electrically connected to the second input node, the first bit line and the first input node. The first bit-line amplifying module receives a voltage level of the second input node to suppress a voltage drop of the first bit line, and the first bit-line amplifying module amplifies a voltage level of the first input node according to a voltage level of the first bit line. The second bit-line amplifying module is electrically connected to the first input node, the second bit line and the second input node. The second bit-line amplifying module receives the voltage level of the first input node to suppress a voltage drop of the second bit line, and the second bit-line amplifying module amplifies the voltage level of the second input node according to a voltage level of the second bit line. There is a read voltage difference between the voltage level of the first bit line and the voltage level of the second bit line. There is a margin enhanced voltage difference between the voltage level of the first input node and the voltage level of the second input node, and the margin enhanced voltage difference is greater than the read voltage difference.

According to further another aspect of the present disclosure, an operating method of the voltage-enhanced-feedback sense amplifier of the resistive memory provides a voltage level applying step, a first voltage margin enhancing step, a second voltage margin enhancing step and a sensing output step. The voltage level applying step is for applying a plurality of voltage levels to the first bit line, the second bit line and the read voltage, respectively, and generating the voltage level of the first input node and the voltage level of the second input node via the voltage-enhanced-feedback pre-amplifier according to the voltage level of the first bit line and the voltage level of the second bit line, respectively. The first voltage margin enhancing step is for driving the first bit-line amplifying module to receive the voltage level of the second input node to suppress a voltage drop of the first bit line, and driving the first bit-line amplifying module to amplify the voltage level of the first input node according to the voltage level of the first bit line. The second voltage margin enhancing step is for driving the second bit-line amplifying module to receive the voltage level of the first input node to suppress a voltage drop of the second bit line, and driving the second bit-line amplifying module to amplify the voltage level of the second input node according to the voltage level of the second bit line. The sensing output step is for driving the voltage sense amplifier to generate a first output signal and a second output signal according to the voltage level of the first input node, the voltage level of the second input node and a sense amplifier enable signal.

BRIEF DESCRIPTION OF THE DRAWINGS

The present disclosure can be more fully understood by reading the following detailed description of the embodiment, with reference made to the accompanying drawings as follows.

DETAILED DESCRIPTION

Before describing any embodiments in detail, some terms used in the following are described. A voltage level of "1" represents that the voltage is equal to a power supply voltage VDD. The voltage level of "0" represents that the voltage is equal to a ground voltage VSS. A PMOS transistor and an NMOS transistor represent a P-type MOS transistor and an N-type MOS transistor, respectively. Each transistor has a source, a drain and a gate.

Figure 1:
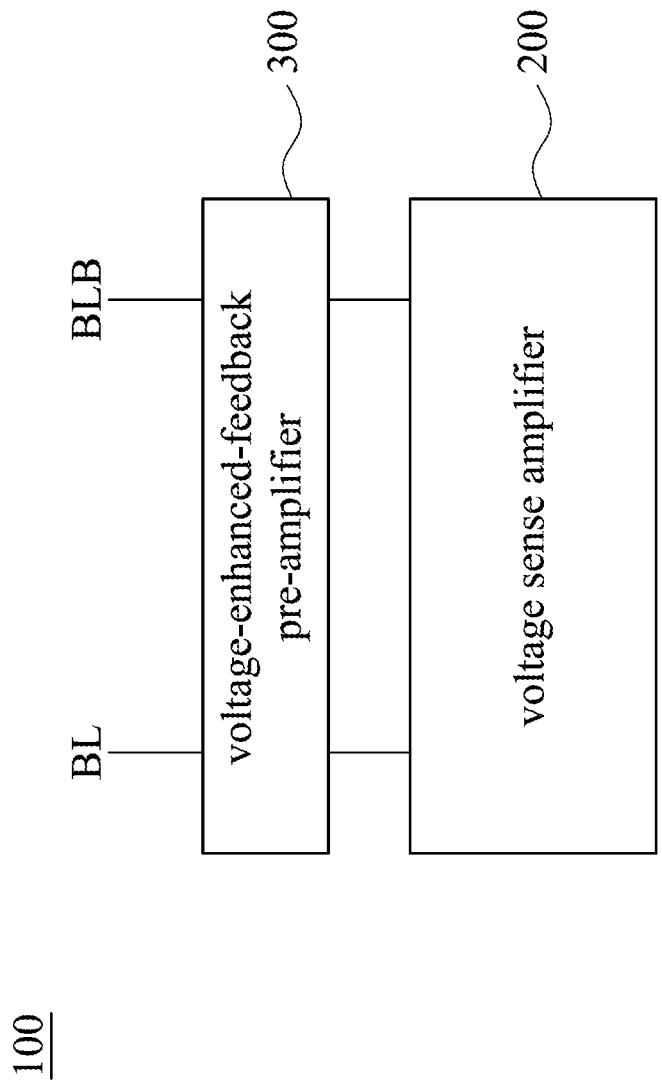
FIG. 1 shows a block diagram of a voltage-enhanced-feedback sense amplifier of a resistive memory according to one embodiment of the present disclosure.
Figure 2:
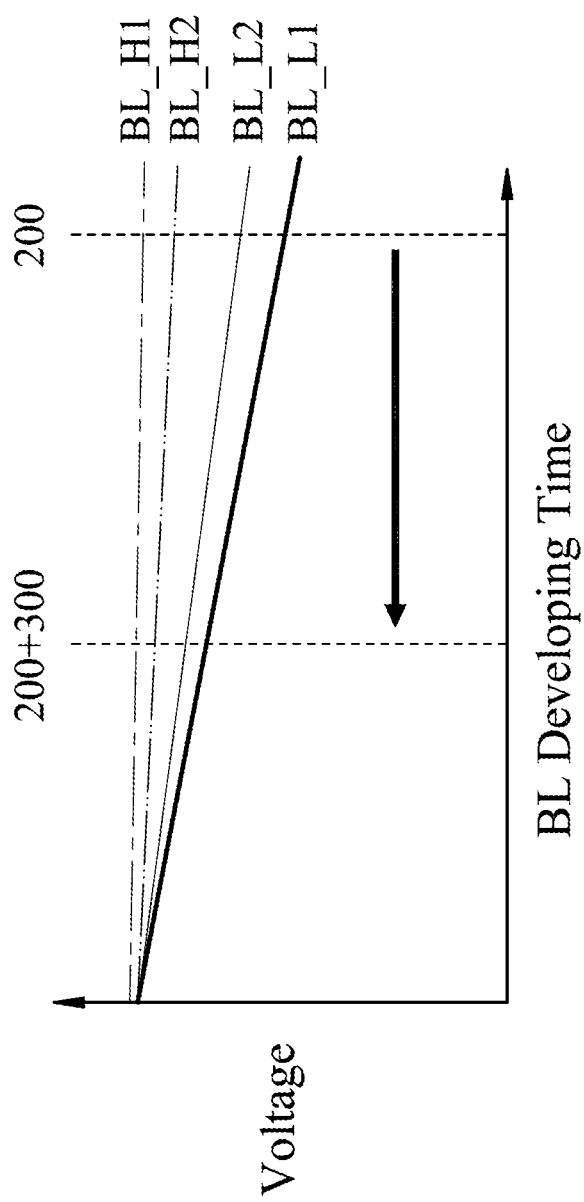
FIG. 2 shows timing diagrams of voltages of a first bit line and a second bit line of FIG. 1.
Figure 3:
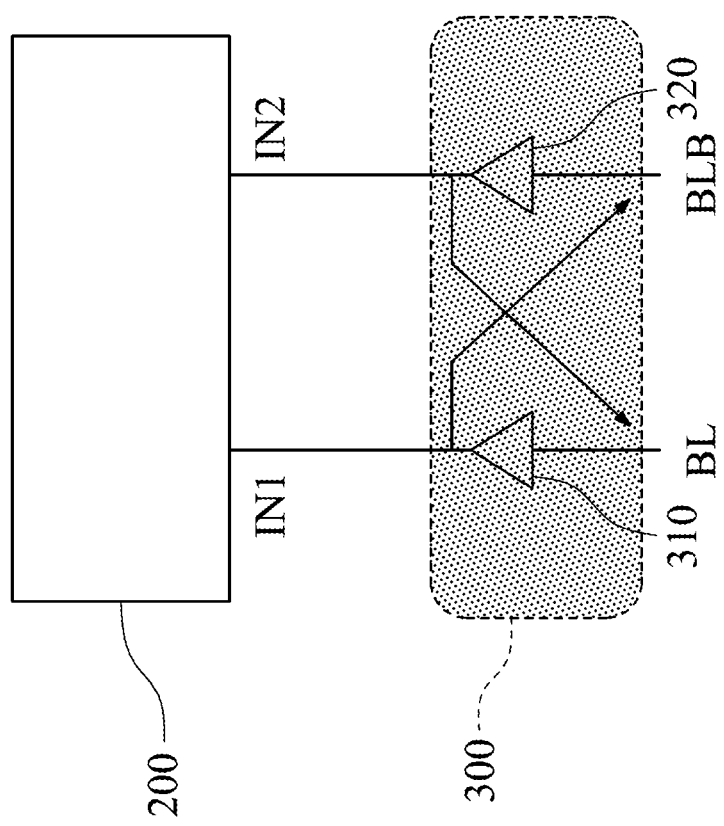
FIG. 3 shows a schematic circuit diagram of the voltage-enhanced-feedback sense amplifier of the resistive memory of FIG. 1.
Figure 4:
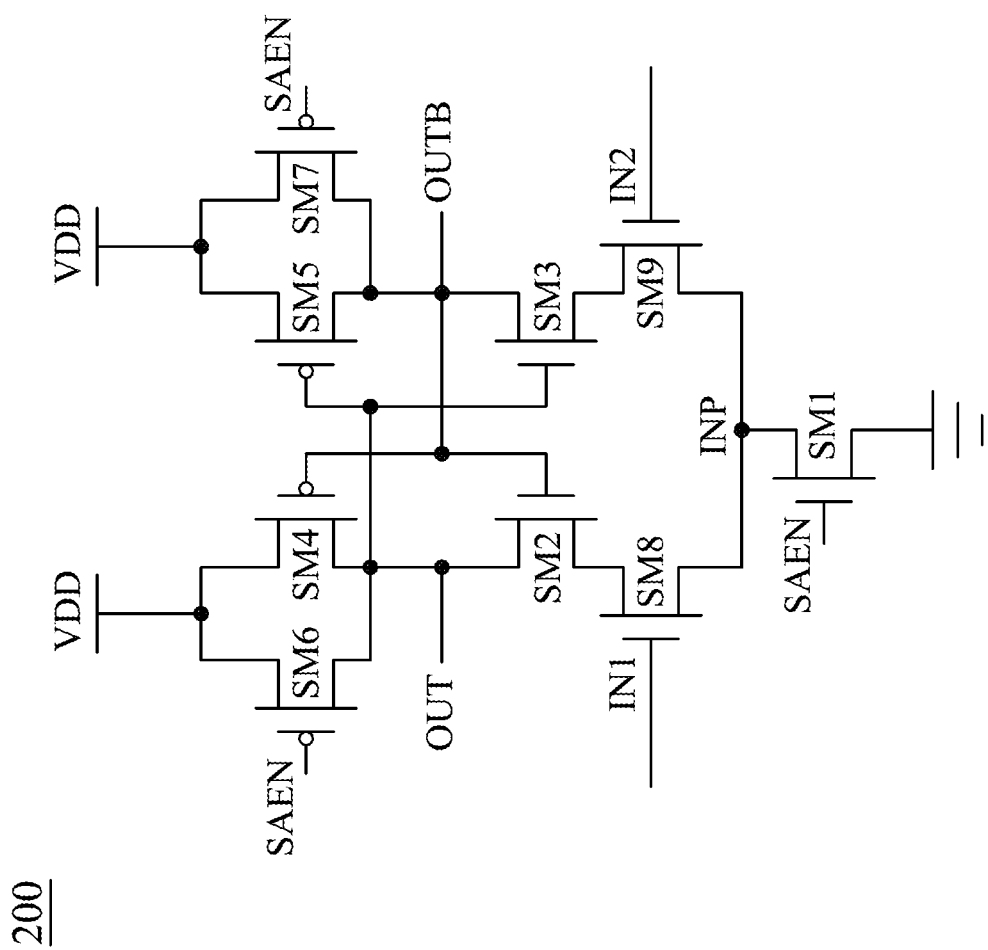
FIG. 4 shows a circuit diagram of a voltage sense amplifier of the voltage-enhanced-feedback sense amplifier of the resistive memory of FIG. 1.
Figure 5:
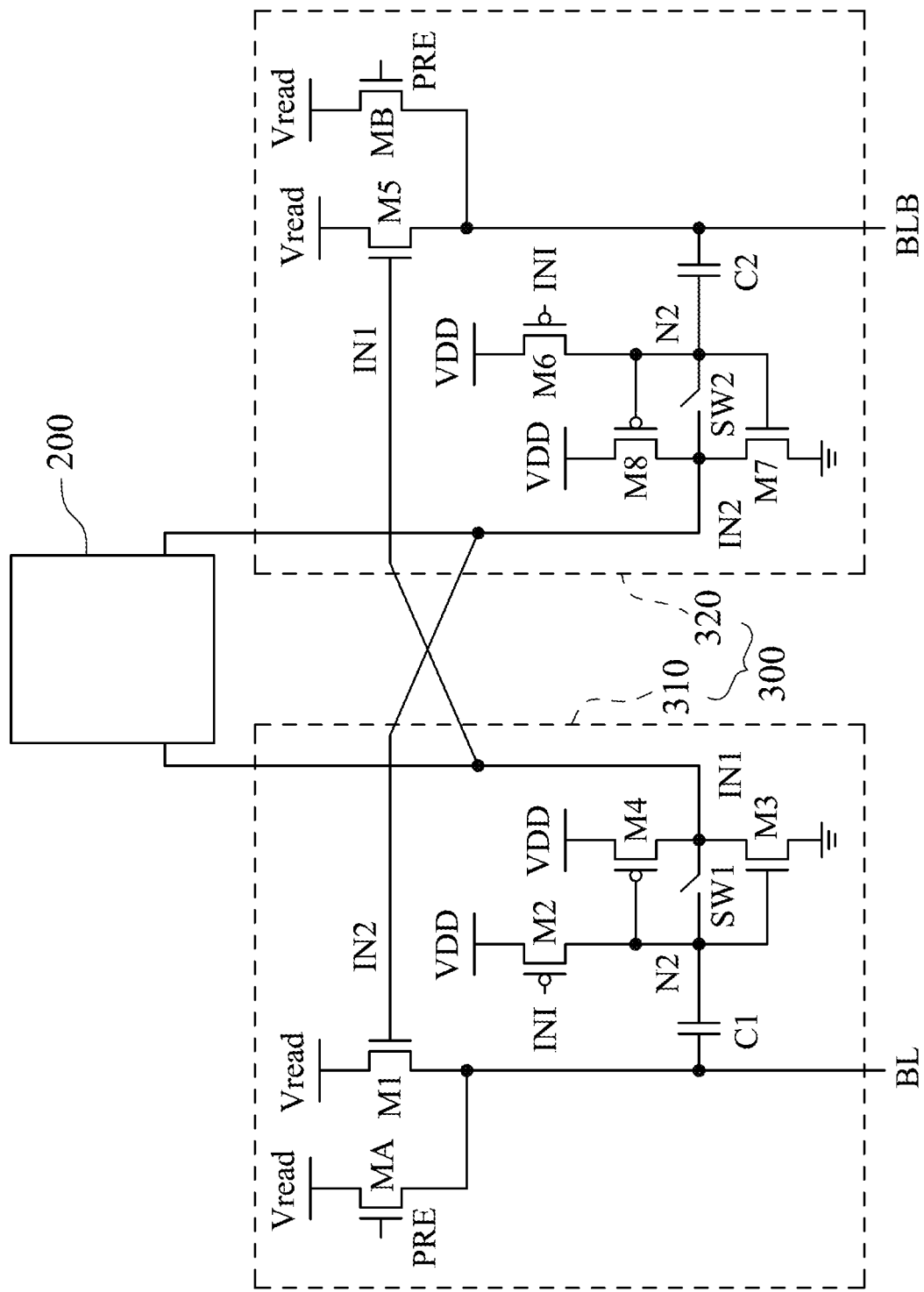
FIG. 5 shows a circuit diagram of the voltage-enhanced-feedback sense amplifier of the resistive memory of FIG. 3.

FIG. 1 shows a block diagram of a voltage-enhanced-feedback sense amplifier 100 of a resistive memory according to one embodiment of the present disclosure; FIG. 2 shows timing diagrams of voltages of a first bit line BL and a second bit line BLB of FIG. 1; FIG. 3 shows a schematic circuit diagram of the voltage-enhanced-feedback sense amplifier 100 of the resistive memory of FIG. 1; FIG. 4 shows a circuit diagram of a voltage sense amplifier 200 of the voltage-enhanced-feedback sense amplifier 100 of the resistive memory of FIG. 1; and FIG. 5 shows a circuit diagram of the voltage-enhanced-feedback sense amplifier 100 of the resistive memory of FIG. 3. The voltage-enhanced-feedback sense amplifier 100 of the resistive memory is configured to sense the first bit line BL and the second bit line BLB. The resistive memory may be a spin-torque transfer memory random access memory (STT-MRAM), a resistive random access memory (ReRAM) or a high-speed small-capacity memory. The voltage-enhanced-feedback sense amplifier 100 of the resistive memory includes a voltage sense amplifier 200 and a voltage-enhanced-feedback pre-amplifier 300.

The voltage sense amplifier 200 has a first input node IN1, a second input node IN2, an inner node INP, a first output node OUT and a second output node OUTB, as shown in FIG. 4. The voltage sense amplifier 200 includes a first sense-amplifier transistor SM1, a second sense-amplifier transistor SM2, a third sense-amplifier transistor SM3, a fourth sense-amplifier transistor SM4, a fifth sense-amplifier transistor SM5, a sixth sense-amplifier transistor SM6, a seventh sense-amplifier transistor SM7, an eighth sense-amplifier transistor SM8 and a ninth sense-amplifier transistor SM9. The first sense-amplifier transistor SM1 is connected between the inner node INP and the ground voltage VSS. The second sense-amplifier transistor SM2 is connected to the first output node OUT and the second output node OUTB. The third sense-amplifier transistor SM3 is connected to the first output node OUT and the second output node OUTB. The fourth sense-amplifier transistor SM4 is connected between the second sense-amplifier transistor SM2 and the power supply voltage VDD. The fourth sense-amplifier transistor SM4 is connected to the first output node OUT and the second output node OUTB. The fifth sense-amplifier transistor SM5 is connected between the third sense-amplifier transistor SM3 and the power supply voltage VDD. The fifth sense-amplifier transistor SM5 is connected to the first output node OUT and the second output node OUTB. The sixth sense-amplifier transistor SM6 is connected between the second sense-amplifier transistor SM2 and the power supply voltage VDD. The sixth sense-amplifier transistor SM6 is connected to the first output node OUT. The seventh sense-amplifier transistor SM7 is connected between the third sense-amplifier transistor SM3 and the power supply voltage VDD. The seventh sense-amplifier transistor SM7 is connected to the second output node OUTB. The eighth sense-amplifier transistor SM8 is connected between the second sense-amplifier transistor SM2 and the first sense-amplifier transistor SM1. The eighth sense-amplifier transistor SM8 is connected to the inner node INP and the first input node IN1. The ninth sense-amplifier transistor SM9 is connected between the third sense-amplifier transistor SM3 and the first sense-amplifier transistor SM1. The ninth sense-amplifier transistor SM9 is connected to the inner node INP and the second input node IN2. Each of the first sense-amplifier transistor SM1, the second sense-amplifier transistor SM2, the third sense-amplifier transistor SM3, the eighth sense-amplifier transistor SM8 and the ninth sense-amplifier transistor SM9 is the NMOS transistor. Each of the fourth sense-amplifier transistor SM4, the fifth sense-amplifier transistor SM5, the sixth sense-amplifier transistor SM6 and the seventh sense-amplifier transistor SM7 is the PMOS transistor.

The voltage-enhanced-feedback pre-amplifier 300 is electrically connected to the voltage sense amplifier 200, and the voltage-enhanced-feedback pre-amplifier 300 includes a first bit-line amplifying module 310 and a second bit-line amplifying module 320. The first bit-line amplifying module 310 has a first internal node N1 and includes a first transistor M1, a first capacitor C1, a second transistor M2, a third transistor M3, a fourth transistor M4, a first switching element SW1 and a first precharge transistor MA. The first transistor M1 is coupled to a read voltage Vread, the first bit line BL and the second input node IN2. The first capacitor C1 is coupled between the first bit line BL and the first internal node N1. The second transistor M2 is coupled between the power supply voltage VDD and the first internal node N1. The third transistor M3 is coupled to the first input node IN1, the first internal node N1 and the ground voltage VSS. The fourth transistor M4 is coupled to the power supply voltage VDD, the first input node IN1 and the first internal node N1. The first switching element SW1 is coupled between the first input node IN1 and the first internal node N1. The first precharge transistor MA is coupled between the read voltage Vread and the first bit line BL. In addition, the second bit-line amplifying module 320 has a second internal node N2 and includes a fifth transistor M5, a second capacitor C2, a sixth transistor M6, a seventh transistor M7, an eighth transistor M8, a second switching element SW2 and a second precharge transistor MB. The fifth transistor M5 is coupled to the read voltage Vread, the second bit line BLB and the first input node IN1. The second capacitor C2 is coupled between the second bit line BLB and the second internal node N2. The sixth transistor M6 is coupled between the power supply voltage VDD and the second internal node N2. The seventh transistor M7 is coupled to the second input node IN2, the second internal node N2 and the ground voltage VSS. The eighth transistor M8 is coupled to the power supply voltage VDD, the second input node IN2 and the second internal node N2. The second switching element SW2 is coupled between the second input node IN2 and the second internal node N2. The second precharge transistor MB is coupled to the read voltage Vread and the second bit line BLB. There is a read voltage difference VD1 between a voltage level of the first bit line BL and a voltage level of the second bit line BLB. There is a margin enhanced voltage difference VD2 between a voltage level of the first input node IN1 and a voltage level of the second input node IN2, and the margin enhanced voltage difference VD2 is greater than the read voltage difference VD1. Moreover, the first bit-line amplifying module 310 is electrically connected to the second input node IN2, the first bit line BL and the first input node IN1. The first bit-line amplifying module 310 receives the voltage level of the second input node IN2 to suppress a voltage drop of the first bit line BL, and the first bit-line amplifying module 310 amplifies the voltage level of the first input node IN1 according to the voltage level of the first bit line BL. The second bit-line amplifying module 320 is electrically connected to the first input node IN1, the second bit line BLB and the second input node IN2. The second bit-line amplifying module 320 receives the voltage level of the first input node IN1 to suppress a voltage drop of the second bit line BLB, and the second bit-line amplifying module 320 amplifies the voltage level of the second input node IN2 according to the voltage level of the second bit line BLB.

In FIG. 5, the second transistor M2 and the sixth transistor M6 are controlled by an initial signal INI. The first switching element SW1 and the second switching element SW2 are controlled by a switching signal SW. The first precharge transistor MA and the second precharge transistor MB are controlled by a precharge signal PRE. The read voltage Vread is smaller than the power supply voltage VDD. The first transistor M1 has a first gate, a first drain and a first source. The first gate is coupled to the second input node IN2. The first drain is coupled to the read voltage Vread, and the first source is coupled to the first bit line BL. The second transistor M2 has a second gate, a second drain and a second source. The second gate is coupled to the initial signal INI. The second drain is coupled to the first internal node N1, and the second source is coupled to the power supply voltage VDD. The third transistor M3 has a third gate, a third drain and a third source. The third gate is coupled to the first internal node N1. The third drain is coupled to the first input node IN1, and the third source is coupled to the ground voltage VSS. The fourth transistor M4 has a fourth gate, a fourth drain and a fourth source. The fourth gate is coupled to the first internal node N1. The fourth drain is coupled to the first input node IN1, and the fourth source is coupled to the power supply voltage VDD. The first precharge transistor MA has a first precharge gate, a first precharge drain and a first precharge source. The first precharge gate is coupled to the precharge signal PRE. The first precharge drain is coupled to the read voltage Vread, and the first precharge source is coupled to the first bit line BL. The fifth transistor M5 has a fifth gate, a fifth drain and a fifth source. The fifth gate is coupled to the first input node IN1. The fifth drain is coupled to the read voltage Vread, and the fifth source is coupled to the second bit line BLB. The sixth transistor M6 has a sixth gate, a sixth drain and a sixth source. The sixth gate is coupled to the initial signal INI. The sixth drain is coupled to the second internal node N2, and the sixth source is coupled to the power supply voltage VDD. The seventh transistor M7 has a seventh gate, a seventh drain and a seventh source. The seventh gate is coupled to the second internal node N2. The seventh drain is coupled to the second input node IN2, and the seventh source is coupled to the ground voltage VSS. The eighth transistor M8 has an eighth gate, an eighth drain and an eighth source. The eighth gate is coupled to the second internal node N2. The eighth drain is coupled to the second input node IN2, and the eighth source is coupled to the power supply voltage VDD. The second precharge transistor MB has a second precharge gate, a second precharge drain and a second precharge source. The second precharge gate is coupled to the precharge signal PRE. The second precharge drain is coupled to the read voltage Vread, and the second precharge source is coupled to the second bit line BLB. Each of the first transistor M1, the third transistor M3, the first precharge transistor MA, the fifth transistor M5, the seventh transistor M7 and the second precharge transistor MB is the NMOS transistor. Each of the second transistor M2, the fourth transistor M4, the sixth transistor M6 and the eighth transistor M8 is the PMOS transistor. Therefore, the voltage-enhanced-feedback sense amplifier 100 of the resistive memory of the present disclosure utilizes the voltage-enhanced-feedback pre-amplifier 300 with a high gain and a cross-coupling technique to further suppress the voltage drop of the opposite bit line, thereby being capable of tolerating a quick voltage drop of the first bit line BL or the second bit line BLB, decreasing developing time, enhancing effective sensing margin and increasing sensing yield.

Figure 6:
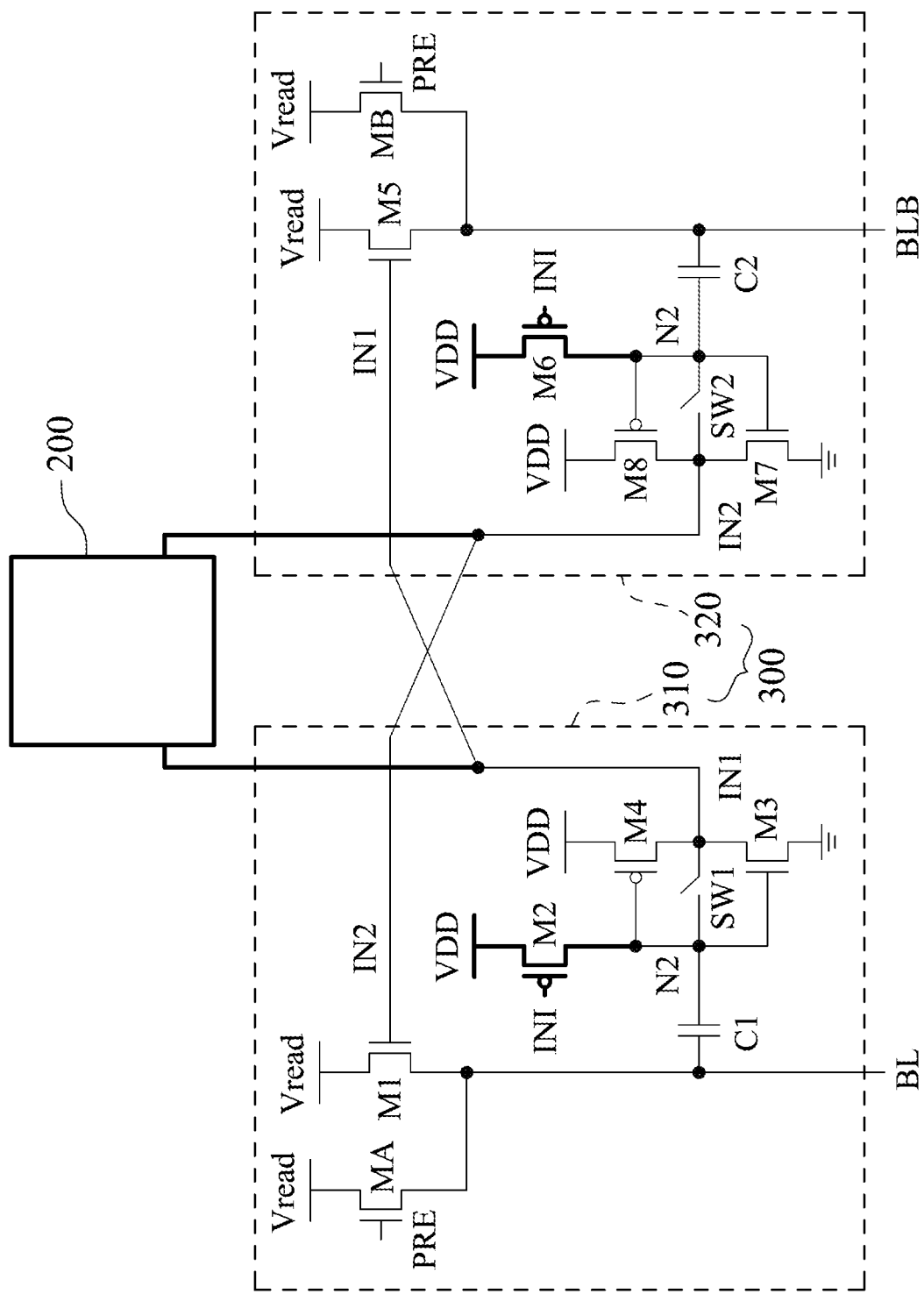
FIG. 6 shows a circuit diagram of an initial operation of the voltage-enhanced-feedback sense amplifier of the resistive memory of FIG. 5, during an initial time interval.
Figure 7:
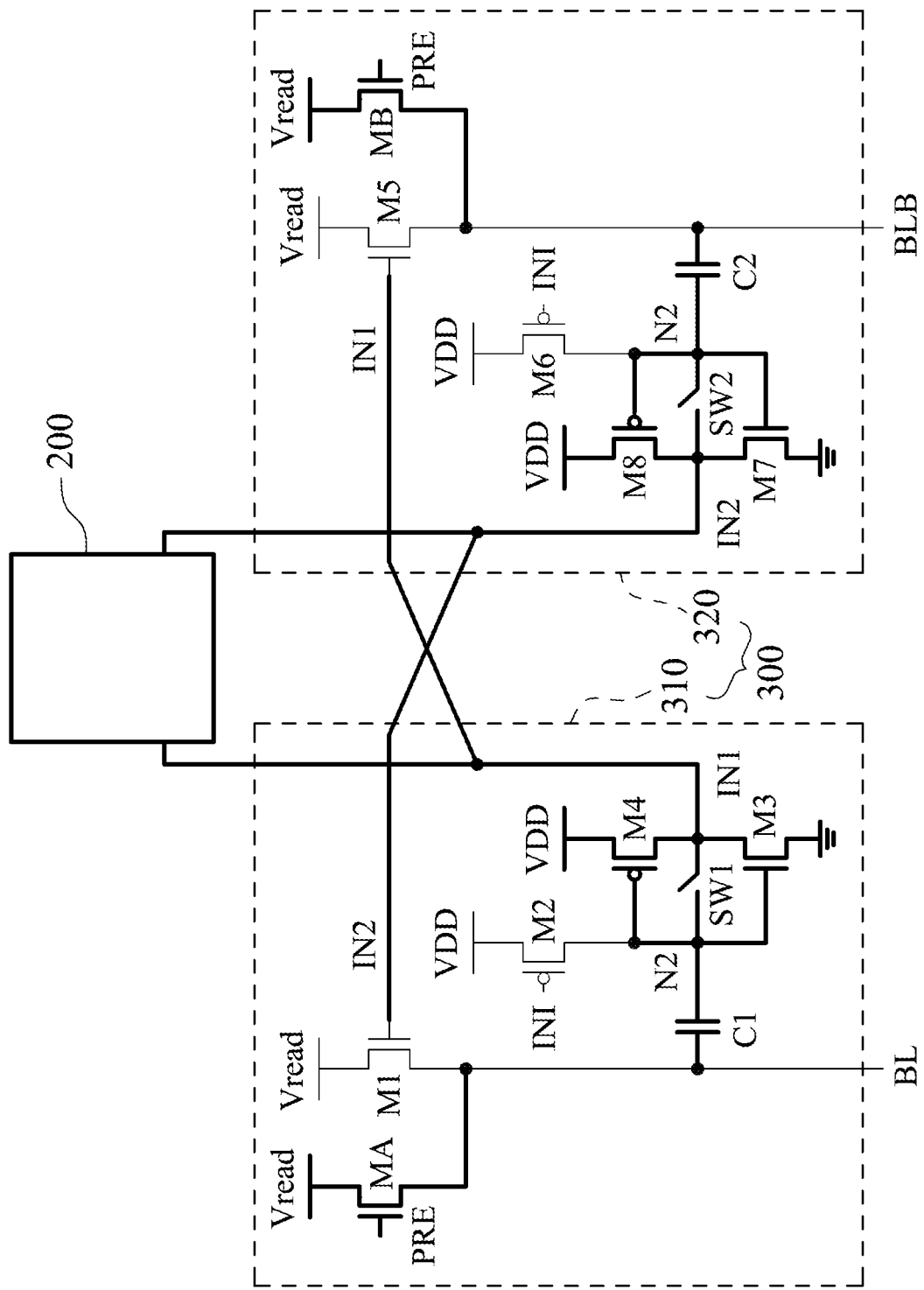
FIG. 7 shows a circuit diagram of a first operation of the voltage-enhanced-feedback sense amplifier of the resistive memory of FIG. 5, during a first time interval.
Figure 8:
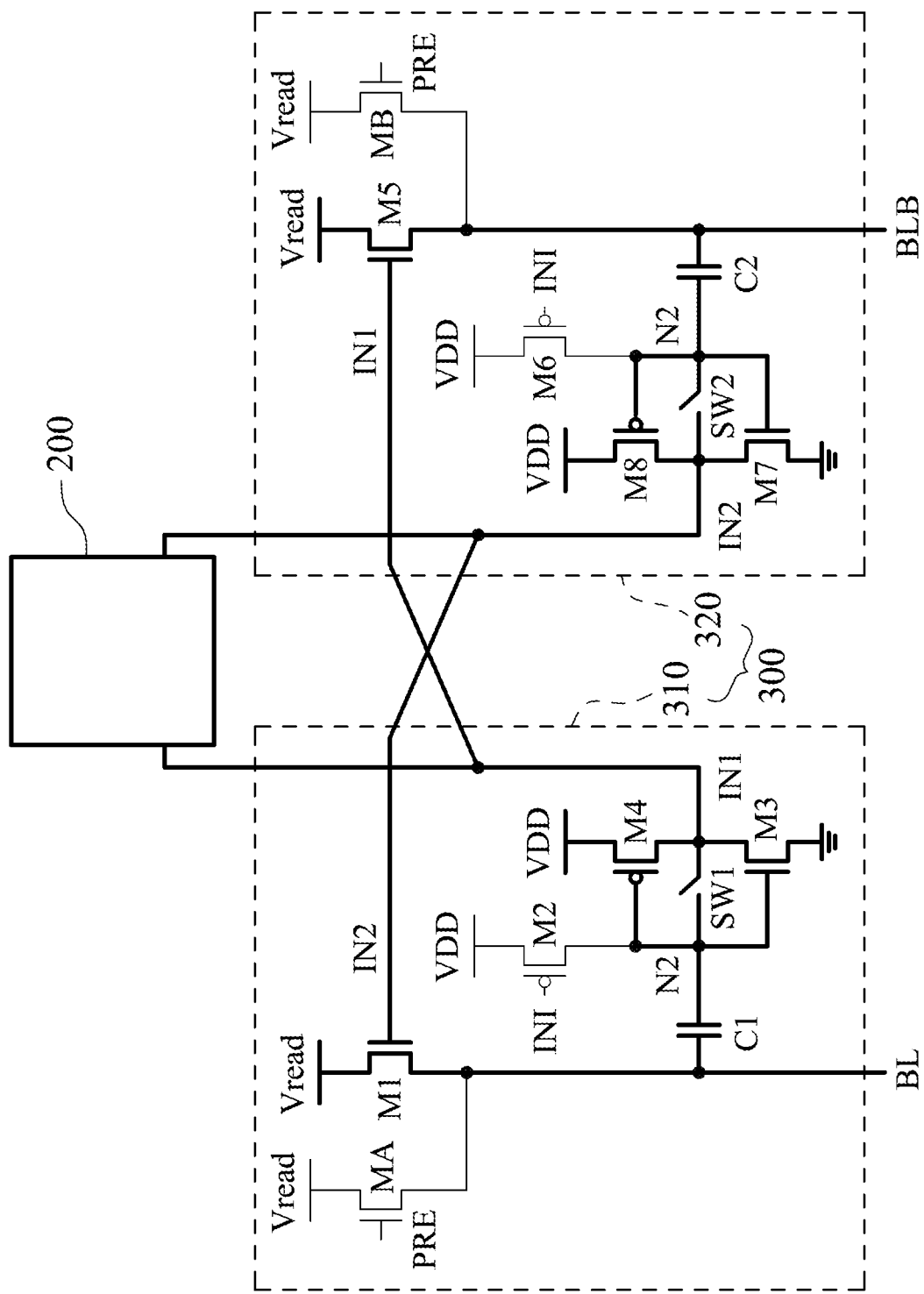
FIG. 8 shows a circuit diagram of a second operation of the voltage-enhanced-feedback sense amplifier of the resistive memory of FIG. 5, during a second time interval.
Figure 9:
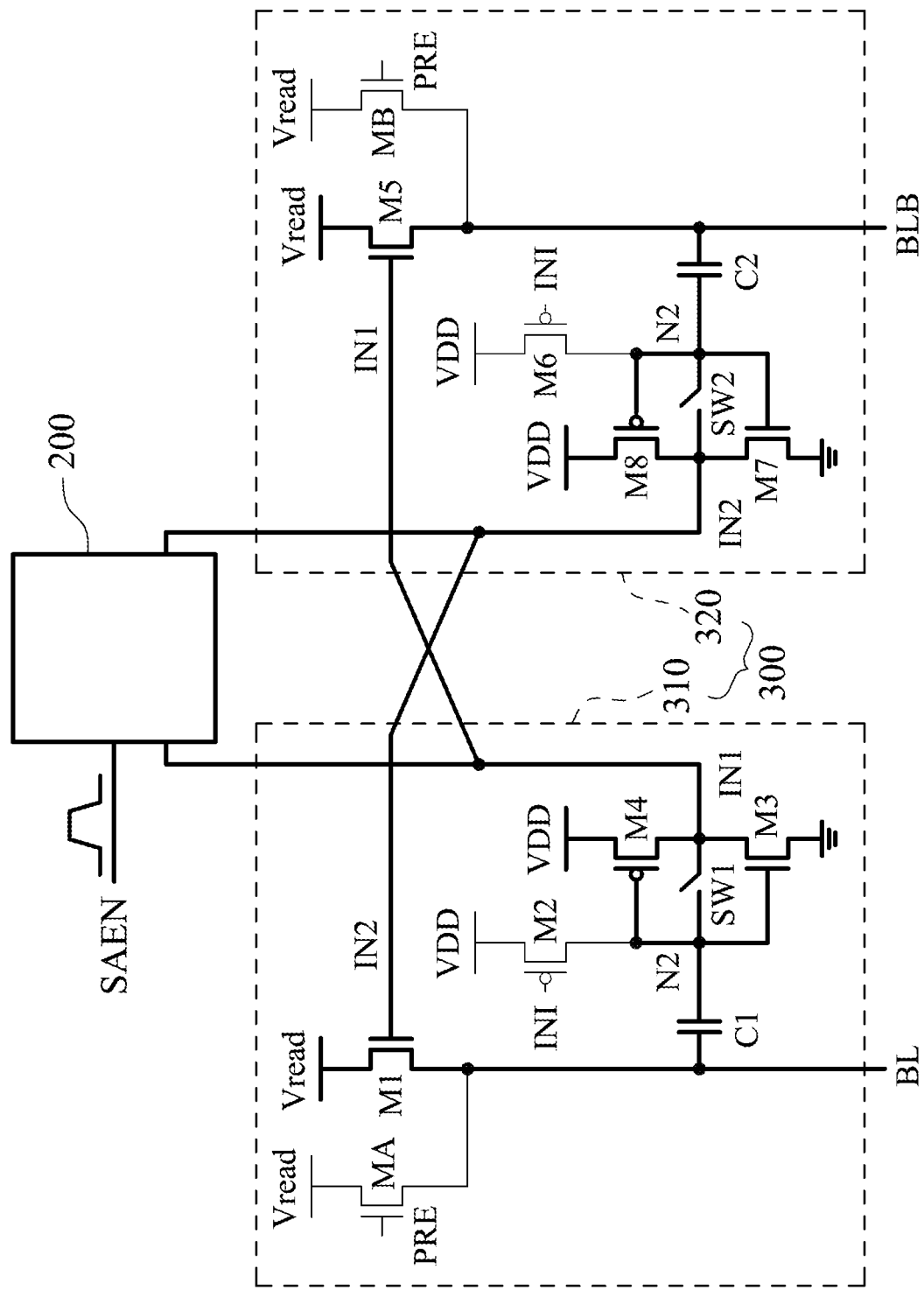
FIG. 9 shows a circuit diagram of a third operation of the voltage-enhanced-feedback sense amplifier of the resistive memory of FIG. 5, during a third time interval.

FIG. 6 shows a circuit diagram of an initial operation of the voltage-enhanced-feedback sense amplifier 100 of the resistive memory of FIG. 5, during an initial time interval P0; FIG. 7 shows a circuit diagram of a first operation of the voltage-enhanced-feedback sense amplifier 100 of the resistive memory of FIG. 5, during a first time interval P1. FIG. 8 shows a circuit diagram of a second operation of the voltage-enhanced-feedback sense amplifier 100 of the resistive memory of FIG. 5, during a second time interval P2; FIG. 9 shows a circuit diagram of a third operation of the voltage-enhanced-feedback sense amplifier 100 of the resistive memory of FIG. 5, during a third time interval P3; and FIG. 10 shows timing diagrams of voltage levels of control signals of FIGS. 6-9.

Figure 10:
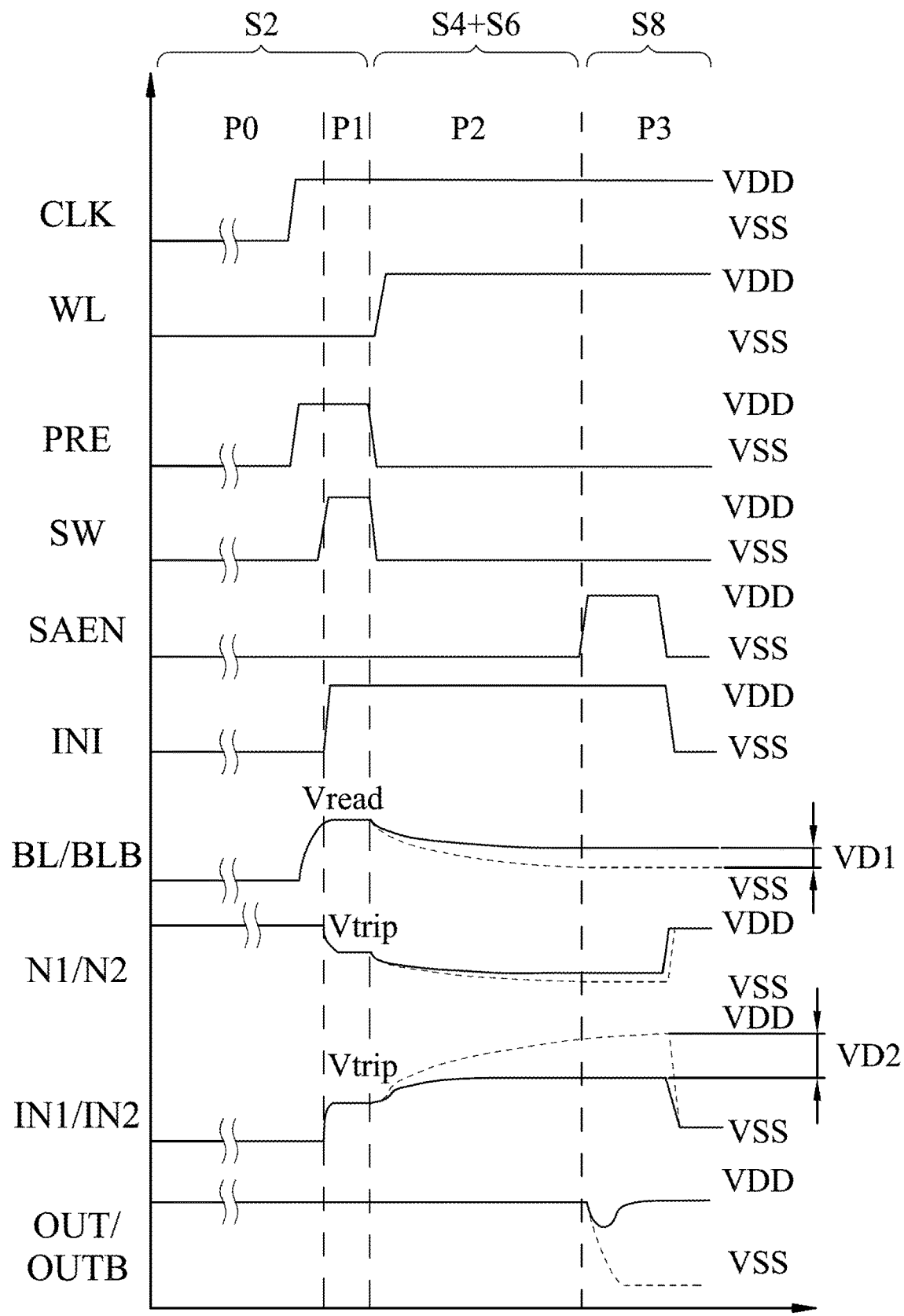
FIG. 10 shows timing diagrams of voltage levels of control signals of FIGS. 6-9.

In FIGS. 6 and 10, the initial operation of the voltage-enhanced-feedback sense amplifier 100 of the resistive memory is performed during the initial time interval P0. During the initial time interval P0, the first internal node N1 and the second internal node N2 are precharged, and the first input node IN1 and the second input node IN2 are discharged, thereby resetting the voltage levels of the voltage-enhanced-feedback pre-amplifier 300. At the beginning of the initial time interval P0, the voltage levels of the control signals CLK, WL, the precharge signal PRE, the switching signal SW, a sense amplifier enable signal SAEN, the initial signal INI, the first bit line BL, the second bit line BLB, the first input node IN1 and the second input node IN2 are equal to the ground voltage VSS. The voltage levels of the first internal node N1, the second internal node N2, the first output node OUT and the second output node OUTB are equal to the power supply voltage VDD.

In FIGS. 7 and 10, the first operation of the voltage-enhanced-feedback sense amplifier 100 of the resistive memory is performed during the first time interval P1. The first operation is corresponding to the read operation. During the first time interval P1, the first bit line BL and the second bit line BLB are precharged to the read voltage Vread via the first precharge transistor MA, the second precharge transistor MB and the precharge signal PRE. Simultaneously, the first switching element SW1 and the second switching element SW2 are turned on by the switching signal SW to perform an auto-zero operation and allow the voltage-enhanced-feedback pre-amplifier 300 to reach a high gain operation region. The initial signal IN1 and the switching signal SW are synchronously switched from the ground voltage VSS to the power supply voltage VDD at the beginning of the first time interval P1. The switching signal SW and the precharge signal PRE are synchronously switched from the power supply voltage VDD to the ground voltage VSS at the end of the first time interval P1. The voltage levels of the control signal WL and the sense amplifier enable signal SAEN are equal to the ground voltage VSS. The voltage levels of the control signal CLK, the precharge signal PRE, the switching signal SW, the initial signal IN1, the first output node OUT and the second output node OUTB are equal to the power supply voltage VDD. The voltage levels of the first internal node N1, the second internal node N2, the first input node IN1 and the second input node IN2 are equal to a trip voltage Vtrip. The trip voltage Vtrip is less than the power supply voltage VDD and greater than the read voltage Vread and the ground voltage VSS.

In FIGS. 8 and 10, the second operation of the voltage-enhanced-feedback sense amplifier 100 of the resistive memory is performed during the second time interval P2. During the second time interval P2, the control signal WL is turned on, and the voltage levels of the first bit line BL and the second bit line BLB are controlled by the first input node IN1 and the second input node IN2, respectively. Voltage swings of the first bit line BL and the second bit line BLB are pre-amplified to the first input node IN1 and the second input node IN2 by the third transistor M3, the fourth transistor M4, the seventh transistor M7 and the eighth transistor M8. Then, a larger voltage swing of the first input node IN1 or the second input node IN2 may further suppress a voltage drop of the opposite bit line (i.e., the first bit line BL or the second bit line BLB) by turning on the first transistor M1 or the second transistor M2, thus enhancing a sensing margin. In other words, the larger voltage swing of the first input node IN1 may further suppress a voltage drop of the second bit line BLB by turning on the second transistor M2, and the larger voltage swing of the second input node IN2 may further suppress a voltage drop of the first bit line BL by turning on the first transistor M1.

In FIGS. 9 and 10, the third operation of the voltage-enhanced-feedback sense amplifier 100 of the resistive memory is performed during a third time interval P3. During a third time interval P3, the sense amplifier enable signal SAEN is turned on to active the voltage sense amplifier 200 so as to read out the data from the resistive memory. A read voltage difference VD1 between the voltage level of the first bit line BL and the voltage level of the second bit line BLB is generated by the voltage-enhanced-feedback pre-amplifier 300. A margin enhanced voltage difference VD2 between the voltage level of the first input node IN1 and the voltage level of the second input node IN2 is generated by the voltage-enhanced-feedback pre-amplifier 300. The margin enhanced voltage difference VD2 is greater than the read voltage difference VD1.

Figure 11:
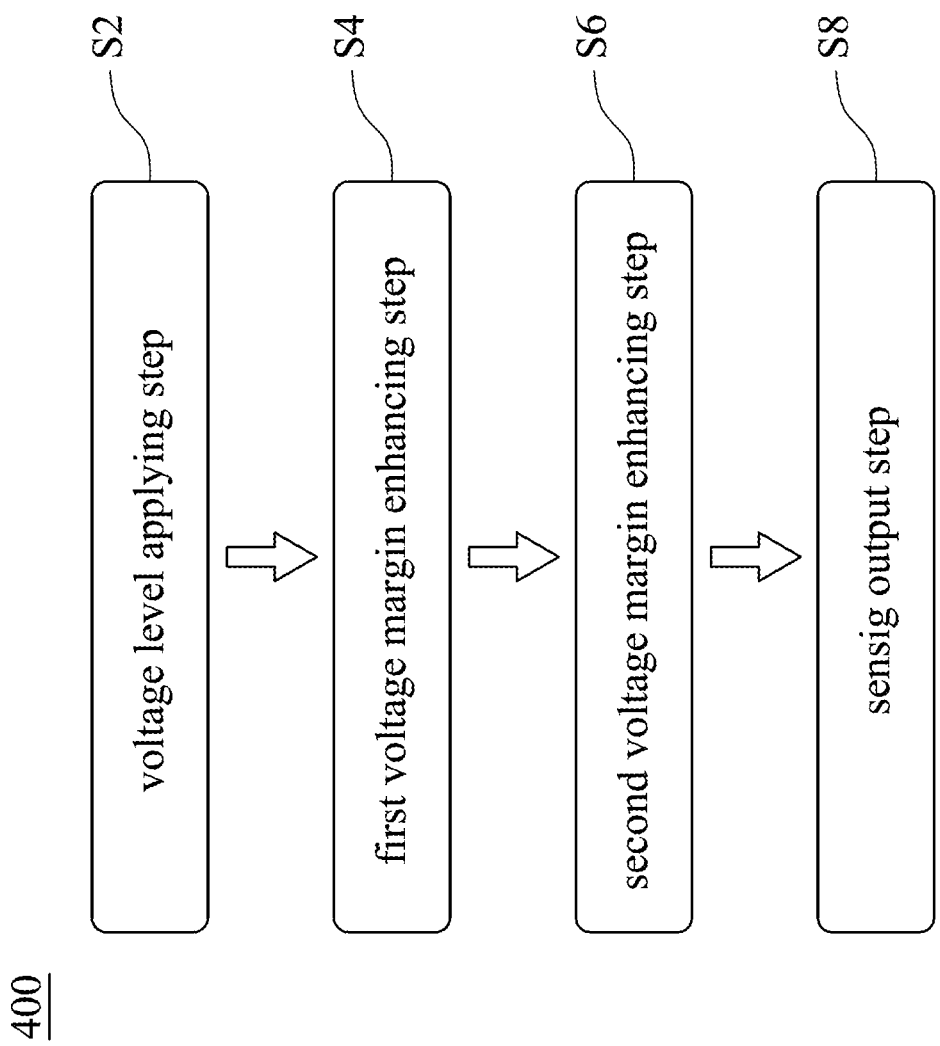
FIG. 11 shows a flow chart of an operating method of a voltage-enhanced-feedback sense amplifier of a resistive memory according to another embodiment of the present disclosure.

FIG. 11 shows a flow chart of an operating method 400 of a voltage-enhanced-feedback sense amplifier 100 of a resistive memory according to another embodiment of the present disclosure. In FIGS. 5 and 11, the operating method 400 provides a voltage level applying step S2, a first voltage margin enhancing step S4, a second voltage margin enhancing step S6 and a sensing output step S8.

The voltage level applying step S2 is for applying a plurality of voltage levels to the first bit line BL, the second bit line BLB and the read voltage Vread, respectively, and generating the voltage level of the first input node IN1 and the voltage level of the second input node IN2 via the voltage-enhanced-feedback pre-amplifier 300 according to the voltage level of the first bit line BL and the voltage level of the second bit line BLB, respectively. The second transistor M2 and the sixth transistor M6 are controlled by an initial signal INI. The first switching element SW1 and the second switching element SW2 are controlled by a switching signal SW. The first precharge transistor MA and the second precharge transistor MB are controlled by a precharge signal PRE. The voltage sense amplifier 200 is controlled by a sense amplifier enable signal SAEN. In the voltage level applying step S2, the initial signal INI and the switching signal SW are synchronously switched from the ground voltage VSS to the power supply voltage VDD. The switching signal SW and the precharge signal PRE are synchronously switched from the power supply voltage VDD to the ground voltage VSS. The voltage level applying step S2 is corresponding to the initial operation in the initial time interval P0 and the first operation in the first time interval P1.

The first voltage margin enhancing step S4 is for driving the first bit-line amplifying module 310 to receive the voltage level of the second input node IN2 to suppress a voltage drop of the first bit line BL, and driving the first bit-line amplifying module 310 to amplify the voltage level of the first input node IN1 according to the voltage level of the first bit line BL. In the first voltage margin enhancing step S4, the first precharge transistor MA of the first bit-line amplifying module 310 is configured to precharge the first bit line BL to the read voltage Vread via the precharge signal PRE, and the second precharge transistor MB of the second bit-line amplifying module 320 is configured to precharge to the read voltage Vread via the precharge signal PRE. The first voltage margin enhancing step S4 is corresponding to the second operation in the second time interval P2.

The second voltage margin enhancing step S6 is for driving the second bit-line amplifying module 320 to receive the voltage level of the first input node IN1 to suppress a voltage drop of the second bit line BLB, and driving the second bit-line amplifying module 320 to amplify the voltage level of the second input node IN2 according to the voltage level of the second bit line BLB. In addition, the first voltage margin enhancing step S4 and the second voltage margin enhancing step S6 are synchronously performed by the voltage-enhanced-feedback pre-amplifier 300 according to the precharge signal PRE, the initial signal INI and the switching signal SW. The second voltage margin enhancing step S6 is corresponding to the second operation in the second time interval P2.

The sensing output step S8 is for driving the voltage sense amplifier 200 to generate a first output signal OUT and a second output signal OUTB according to the voltage level of the first input node IN1, the voltage level of the second input node IN2 and the sense amplifier enable signal SAEN, as shown in FIG. 4. In the sensing output step S8, the read voltage difference VD1 between the voltage level of the first bit line BL and the voltage level of the second bit line BLB is generated by the voltage-enhanced-feedback pre-amplifier 300. The margin enhanced voltage difference VD2 between the voltage level of the first input node IN1 and the voltage level of the second input node IN2 is generated by the voltage-enhanced-feedback pre-amplifier 300. The margin enhanced voltage difference VD2 is greater than the read voltage difference VD1. The sensing output step S8 is corresponding to the third operation in the third time interval P3. Accordingly, the operating method 400 of the present disclosure can decrease developing time so as to enhance effective sensing margin and increase sensing yield, and the operating method 400 of the present disclosure is suitable for the resistive type memory having a low resistive value, e.g., the spin-torque transfer memory random access memory (STT-MRAM), the resistive random access memory (ReRAM) or the high-speed small-capacity memory.

Figure 12:
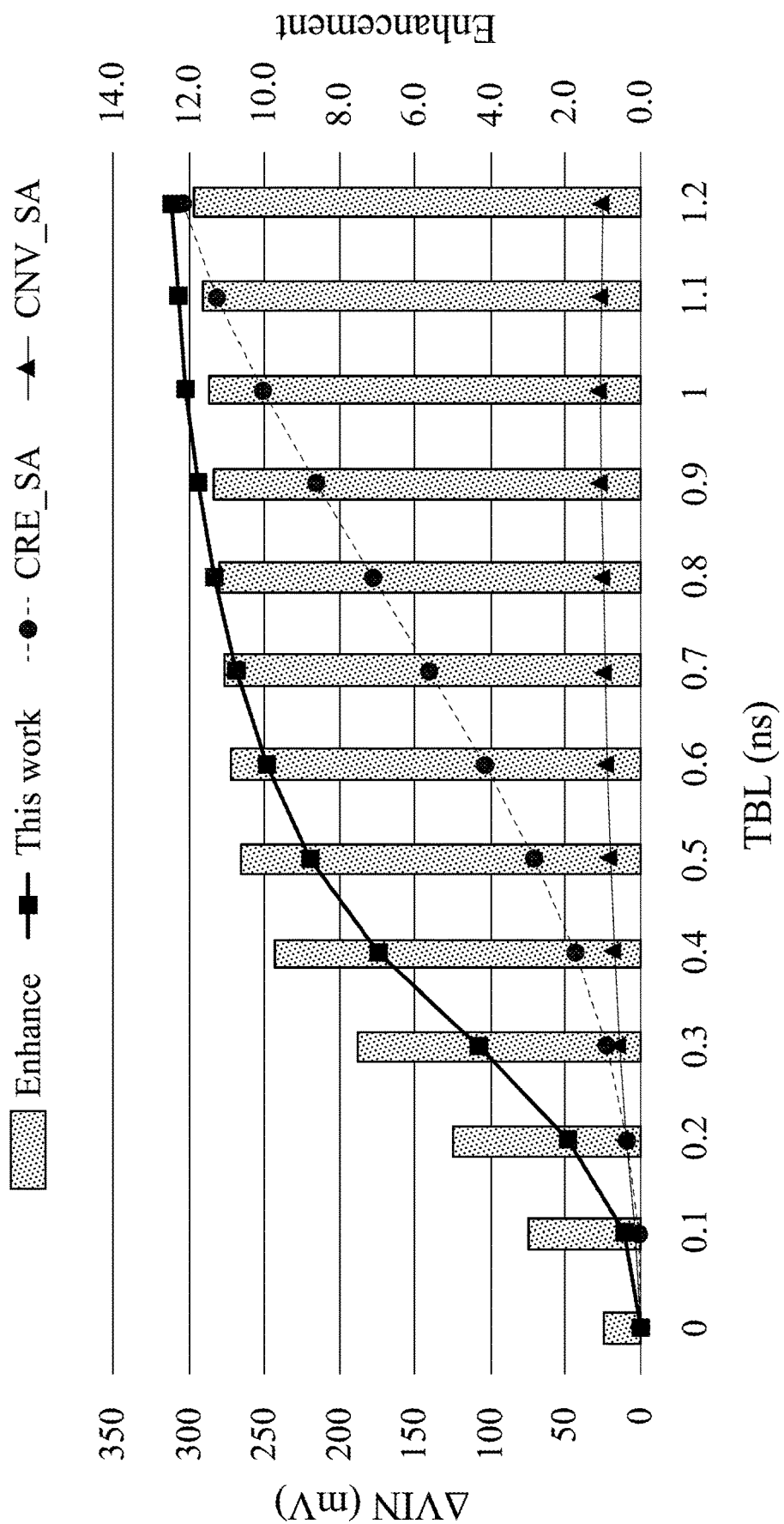
FIG. 12 shows a margin enhancement comparison result between the operating method of the present disclosure and two conventional methods.

FIG. 12 shows a margin enhancement comparison result between the operating method 400 of the present disclosure and two conventional methods. The two conventional methods represent an operating method of a conventional continuously-recording-and-enhancement sense simplifier (SRE_SA) and an operating method of a conventional differential voltage sense simplifier (CNV_SA), respectively. "ΔVIN" represents the margin enhanced voltage difference VD2 of the present disclosure, the read voltage difference VD1 of the conventional differential voltage sense simplifier and the margin enhanced voltage difference VD2 of the conventional continuously-recording-and-enhancement sense simplifier. "TBL" represents the second time interval P2 and the third time interval P3 of FIG. 10. In FIG. 12, the operating method 400 of the present disclosure can increase the margin enhancement by about 12.6 times, compared to the operating method of the conventional differential voltage sense simplifier. In addition, an enhancing speed of the operating method 400 of the present disclosure is higher than an enhancing speed of the operating method of a conventional continuously-recording-and-enhancement sense simplifier.

According to the aforementioned embodiments and examples, the advantages of the present disclosure are described as follows.

1. The voltage-enhanced-feedback sense amplifier of the resistive memory of the present disclosure utilizes the voltage-enhanced-feedback pre-amplifier with a high gain and a cross-coupling technique to further suppress the voltage drop of the opposite bit line, thereby being capable of tolerating a quick voltage drop of the opposite bit line.

2. The voltage-enhanced-feedback sense amplifier of the resistive memory and the operating method thereof of the present disclosure can decrease developing time so as to enhance effective sensing margin and increase sensing yield. Therefore, the voltage-enhanced-feedback sense amplifier of the resistive memory and the operating method thereof of the present disclosure are suitable for the resistive type memory having a low resistive value, e.g., a spin-torque transfer memory random access memory (STT-MRAM), a resistive random access memory (ReRAM) or a high-speed small-capacity memory.

3. The operating method of the present disclosure can increase the margin enhancement by about 12.6 times, compared to the operating method of the conventional differential voltage sense simplifier. In addition, an enhancing speed of the operating method of the present disclosure is higher than an enhancing speed of the operating method of a conventional continuously-recording-and-enhancement sense simplifier.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A voltage-enhanced-feedback sense amplifier of a resistive memory, which is configured to sense a first bit line and a second bit line, the voltage-enhanced-feedback sense amplifier of the resistive memory comprising:
 a voltage sense amplifier having a first input node and a second input node; and
 a voltage-enhanced-feedback pre-amplifier electrically connected to the voltage sense amplifier, and the voltage-enhanced-feedback pre-amplifier comprising:
  a first bit-line amplifying module having a first internal node and comprising:
   a first transistor coupled to a read voltage, the first bit line and the second input node;

a first capacitor coupled between the first bit line and the first internal node;

a second transistor coupled between a power supply voltage and the first internal node;

a third transistor coupled to the first input node, the first internal node and a ground voltage;

a fourth transistor coupled to the power supply voltage, the first input node and the first internal node; and a first switching element coupled between the first input node and the first internal node; and a second bit-line amplifying module having a second internal node and comprising:

a fifth transistor coupled to the read voltage, the second bit line and the first input node;

a second capacitor coupled between the second bit line and the second internal node;

a sixth transistor coupled between the power supply voltage and the second internal node;

a seventh transistor coupled to the second input node, the second internal node and the ground voltage;

an eighth transistor coupled to the power supply voltage, the second input node and the second internal node; and a second switching element coupled between the second input node and the second internal node;

wherein there is a read voltage difference between a voltage level of the first bit line and a voltage level of the second bit line, there is a margin enhanced voltage difference between a voltage level of the first input node and a voltage level of the second input node, and the margin enhanced voltage difference is greater than the read voltage difference.

2. The voltage-enhanced-feedback sense amplifier of the resistive memory of claim 1, wherein, the first bit-line amplifying module further comprises:

a first precharge transistor coupled between the read voltage and the first bit line; and the second bit-line amplifying module further comprises:

a second precharge transistor coupled to the read voltage and the second bit line.

3. The voltage-enhanced-feedback sense amplifier of the resistive memory of claim 1, wherein the voltage sense amplifier has an inner node, a first output node and a second output node, and the voltage sense amplifier comprises:

a first sense-amplifier transistor connected between the inner node and the ground voltage;

a second sense-amplifier transistor connected to the first output node and the second output node;

a third sense-amplifier transistor connected to the first output node and the second output node;

a fourth sense-amplifier transistor connected between the second sense-amplifier transistor and the power supply voltage, wherein the fourth sense-amplifier transistor is connected to the first output node and the second output node;

a fifth sense-amplifier transistor connected between the third sense-amplifier transistor and the power supply voltage, wherein the fifth sense-amplifier transistor is connected to the first output node and the second output node;

a sixth sense-amplifier transistor connected between the second sense-amplifier transistor and the power supply voltage, wherein the sixth sense-amplifier transistor is connected to the first output node;

a seventh sense-amplifier transistor connected between the third sense-amplifier transistor and the power supply voltage, wherein the seventh sense-amplifier transistor is connected to the second output node;

an eighth sense-amplifier transistor connected between the second sense-amplifier transistor and the first sense-amplifier transistor, wherein the eighth sense-amplifier transistor is connected to the inner node and the first input node; and a ninth sense-amplifier transistor connected between the third sense-amplifier transistor and the first sense-amplifier transistor, wherein the ninth sense-amplifier transistor is connected to the inner node and the second input node.

4. The voltage-enhanced-feedback sense amplifier of the resistive memory of claim 2, wherein the second transistor and the sixth transistor are controlled by an initial signal, the first switching element and the second switching element are controlled by a switching signal, the first precharge transistor and the second precharge transistor are controlled by a precharge signal, the initial signal and the switching signal are synchronously switched from the ground voltage to the power supply voltage, and the switching signal and the precharge signal are synchronously switched from the power supply voltage to the ground voltage.

5. The voltage-enhanced-feedback sense amplifier of the resistive memory of claim 4, wherein, the read voltage is smaller than the power supply voltage;

the first transistor has a first gate, a first drain and a first source, wherein the first gate is coupled to the second input node, the first drain is coupled to the read voltage, and the first source is coupled to the first bit line;

the second transistor has a second gate, a second drain and a second source, wherein the second gate is coupled to the initial signal, the second drain is coupled to the first internal node, and the second source is coupled to the power supply voltage;

the third transistor has a third gate, a third drain and a third source, wherein the third gate is coupled to the first internal node, the third drain is coupled to the first input node, and the third source is coupled to the ground voltage;

the fourth transistor has a fourth gate, a fourth drain and a fourth source, wherein the fourth gate is coupled to the first internal node, the fourth drain is coupled to the first input node, and the fourth source is coupled to the power supply voltage; and the first precharge transistor has a first precharge gate, a first precharge drain and a first precharge source, wherein the first precharge gate is coupled to the precharge signal, the first precharge drain is coupled to the read voltage, and the first precharge source is coupled to the first bit line.

6. The voltage-enhanced-feedback sense amplifier of the resistive memory of claim 5, wherein, the fifth transistor has a fifth gate, a fifth drain and a fifth source, wherein the fifth gate is coupled to the first input node, the fifth drain is coupled to the read voltage, and the fifth source is coupled to the second bit line;

the sixth transistor has a sixth gate, a sixth drain and a sixth source, wherein the sixth gate is coupled to the initial signal, the sixth drain is coupled to the second internal node, and the sixth source is coupled to the power supply voltage;

the seventh transistor has a seventh gate, a seventh drain and a seventh source, wherein the seventh gate is coupled to the second internal node, the seventh drain is coupled to the second input node, and the seventh source is coupled to the ground voltage;

the eighth transistor has an eighth gate, an eighth drain and an eighth source, wherein the eighth gate is coupled to the second internal node, the eighth drain is coupled to the second input node, and the eighth source is coupled to the power supply voltage; and the second precharge transistor has a second precharge gate, a second precharge drain and a second precharge source, wherein the second precharge gate is coupled to the precharge signal, the second precharge drain is coupled to the read voltage, and the second precharge source is coupled to the second bit line.

7. A voltage-enhanced-feedback sense amplifier of a resistive memory, which is configured to sense a first bit line and a second bit line, the voltage-enhanced-feedback sense amplifier of the resistive memory comprising:

a voltage sense amplifier having a first input node and a second input node; and a voltage-enhanced-feedback pre-amplifier electrically connected to the voltage sense amplifier, and the voltage-enhanced-feedback pre-amplifier comprising:

a first bit-line amplifying module electrically connected to the second input node, the first bit line and the first input node, wherein the first bit-line amplifying module receives a voltage level of the second input node to suppress a voltage drop of the first bit line, and the first bit-line amplifying module amplifies a voltage level of the first input node according to a voltage level of the first bit line; and a second bit-line amplifying module electrically connected to the first input node, the second bit line and the second input node, wherein the second bit-line amplifying module receives the voltage level of the first input node to suppress a voltage drop of the second bit line, and the second bit-line amplifying module amplifies the voltage level of the second input node according to a voltage level of the second bit line;

wherein there is a read voltage difference between the voltage level of the first bit line and the voltage level of the second bit line, there is a margin enhanced voltage difference between the voltage level of the first input node and the voltage level of the second input node, and the margin enhanced voltage difference is greater than the read voltage difference;

wherein the voltage sense amplifier has an inner node, a first output node and a second output node, and the voltage sense amplifier comprises:

a first sense-amplifier transistor connected between the inner node and the ground voltage;

a second sense-amplifier transistor connected to the first output node and the second output node;

a third sense-amplifier transistor connected to the first output node and the second output node;

a fourth sense-amplifier transistor connected between the second sense-amplifier transistor and the power supply voltage, wherein the fourth sense-amplifier transistor is connected to the first output node and the second output node;

a fifth sense-amplifier transistor connected between the third sense-amplifier transistor and the power supply voltage, wherein the fifth sense-amplifier transistor is connected to the first output node and the second output node;

a sixth sense-amplifier transistor connected between the second sense-amplifier transistor and the power supply voltage, wherein the sixth sense-amplifier transistor is connected to the first output node;

a seventh sense-amplifier transistor connected between the third sense-amplifier transistor and the power supply voltage, wherein the seventh sense-amplifier transistor is connected to the second output node;

an eighth sense-amplifier transistor connected between the second sense-amplifier transistor and the first sense-amplifier transistor, wherein the eighth sense-amplifier transistor is connected to the inner node and the first input node; and a ninth sense-amplifier transistor connected between the third sense-amplifier transistor and the first sense-amplifier transistor, wherein the ninth sense-amplifier transistor is connected to the inner node and the second input node.

8. The voltage-enhanced-feedback sense amplifier of the resistive memory of claim 7, wherein, the first bit-line amplifying module comprises:
a first precharge transistor coupled between a read voltage and the first bit line; and the second bit-line amplifying module comprises:
a second precharge transistor coupled to the read voltage and the second bit line.

9. The voltage-enhanced-feedback sense amplifier of the resistive memory of claim 8, wherein, the first bit-line amplifying module has a first internal node and further comprises:
a first transistor coupled to a read voltage, the first bit line and the second input node;
a first capacitor coupled between the first bit line and the first internal node;
a second transistor coupled between a power supply voltage and the first internal node;
a third transistor coupled to the first input node, the first internal node and a ground voltage;
a fourth transistor coupled to the power supply voltage, the first input node and the first internal node; and
a first switching element coupled between the first input node and the first internal node; and the second bit-line amplifying module has a second internal node and further comprises:
a fifth transistor coupled to the read voltage, the second bit line and the first input node;
a second capacitor coupled between the second bit line and the second internal node;
a sixth transistor coupled between the power supply voltage and the second internal node;
a seventh transistor coupled to the second input node, the second internal node and the ground voltage;
an eighth transistor coupled to the power supply voltage, the second input node and the second internal node; and
a second switching element coupled between the second input node and the second internal node.

10. The voltage-enhanced-feedback sense amplifier of the resistive memory of claim 9, wherein the second transistor and the sixth transistor are controlled by an initial signal, the first switching element and the second switching element are controlled by a switching signal, the first precharge transistor and the second precharge transistor are controlled by a precharge signal, the initial signal and the switching signal are synchronously switched from the ground voltage to the power supply voltage, and the switching signal and the precharge signal are synchronously switched from the power supply voltage to the ground voltage.

11. The voltage-enhanced-feedback sense amplifier of the resistive memory of claim 10, wherein, the read voltage is smaller than the power supply voltage;

the first transistor has a first gate, a first drain and a first source, wherein the first gate is coupled to the second input node, the first drain is coupled to the read voltage, and the first source is coupled to the first bit line;

the second transistor has a second gate, a second drain and a second source, wherein the second gate is coupled to the initial signal, the second drain is coupled to the first internal node, and the second source is coupled to the power supply voltage;

the third transistor has a third gate, a third drain and a third source, wherein the third gate is coupled to the first internal node, the third drain is coupled to the first input node, and the third source is coupled to the ground voltage;

the fourth transistor has a fourth gate, a fourth drain and a fourth source, wherein the fourth gate is coupled to the first internal node, the fourth drain is coupled to the first input node, and the fourth source is coupled to the power supply voltage; and the first precharge transistor has a first precharge gate, a first precharge drain and a first precharge source, wherein the first precharge gate is coupled to the precharge signal, the first precharge drain is coupled to the read voltage, and the first precharge source is coupled to the first bit line.

12. The voltage-enhanced-feedback sense amplifier of the resistive memory of claim 11, wherein, the fifth transistor has a fifth gate, a fifth drain and a fifth source, wherein the fifth gate is coupled to the first input node, the fifth drain is coupled to the read voltage, and the fifth source is coupled to the second bit line;

the sixth transistor has a sixth gate, a sixth drain and a sixth source, wherein the sixth gate is coupled to the initial signal, the sixth drain is coupled to the second internal node, and the sixth source is coupled to the power supply voltage;

the seventh transistor has a seventh gate, a seventh drain and a seventh source, wherein the seventh gate is coupled to the second internal node, the seventh drain is coupled to the second input node, and the seventh source is coupled to the ground voltage;

the eighth transistor has an eighth gate, an eighth drain and an eighth source, wherein the eighth gate is coupled to the second internal node, the eighth drain is coupled to the second input node, and the eighth source is coupled to the power supply voltage; and the second precharge transistor has a second precharge gate, a second precharge drain and a second precharge source, wherein the second precharge gate is coupled to the precharge signal, the second precharge drain is coupled to the read voltage, and the second precharge source is coupled to the second bit line.

13. An operating method of the voltage-enhanced-feedback sense amplifier of the resistive memory of claim 1, comprising:

providing a voltage level applying step, wherein the voltage level applying step is for applying a plurality of voltage levels to the first bit line, the second bit line and the read voltage, respectively, and generating the voltage level of the first input node and the voltage level of the second input node via the voltage-enhanced-feedback pre-amplifier according to the voltage level of the first bit line and the voltage level of the second bit line, respectively;

providing a first voltage margin enhancing step, wherein the first voltage margin enhancing step is for driving the first bit-line amplifying module to receive the voltage level of the second input node to suppress a voltage drop of the first bit line, and driving the first bit-line amplifying module to amplify the voltage level of the first input node according to the voltage level of the first bit line;

providing a second voltage margin enhancing step, wherein the second voltage margin enhancing step is for driving the second bit-line amplifying module to receive the voltage level of the first input node to suppress a voltage drop of the second bit line, and driving the second bit-line amplifying module to amplify the voltage level of the second input node according to the voltage level of the second bit line; and providing a sensing output step, wherein the sensing output step is for driving the voltage sense amplifier to generate a first output signal and a second output signal according to the voltage level of the first input node, the voltage level of the second input node and a sense amplifier enable signal.

14. The operating method of claim 13, wherein, in the first voltage margin enhancing step, a first precharge transistor of the first bit-line amplifying module is configured to precharge the first bit line to the read voltage via a precharge signal, and a second precharge transistor of the second bit-line amplifying module is configured to precharge to the read voltage via the precharge signal.

15. The operating method of claim 14, wherein the second transistor and the sixth transistor are controlled by an initial signal, the first switching element and the second switching element are controlled by a switching signal, the first precharge transistor and the second precharge transistor are controlled by the precharge signal, and the voltage sense amplifier is controlled by the sense amplifier enable signal.

16. The operating method of claim 13, wherein, in the sensing output step, the read voltage difference between the voltage level of the first bit line and the voltage level of the second bit line is generated by the voltage-enhanced-feedback pre-amplifier, the margin enhanced voltage difference between the voltage level of the first input node and the voltage level of the second input node is generated by the voltage-enhanced-feedback pre-amplifier, and the margin enhanced voltage difference is greater than the read voltage difference.

17. The operating method of claim 13, wherein, in the voltage level applying step, the initial signal and the switching signal are synchronously switched from the ground voltage to the power supply voltage, and the switching signal and the precharge signal are synchronously switched from the power supply voltage to the ground voltage.

18. The operating method of claim 13, wherein the first voltage margin enhancing step and the second voltage margin enhancing step are synchronously performed by the voltage-enhanced-feedback pre-amplifier according to the precharge signal, the initial signal and the switching signal.

* * * * *